United States Patent [19]
Gruber

[11] 3,946,318
[45] Mar. 23, 1976

[54] AUTOMATIC LEVEL CONTROL CIRCUIT FOR LOCAL OSCILLATOR SIGNALS WITH THE LEVER CONTROL SIGNAL BEING DERIVED FROM THE DC CURRENT PRESENT IN THE DIODE CIRCUIT OF AN MIC FREQUENCY MIXER

[75] Inventor: Alan Herbert Gruber, Cedar Grove, N.J.

[73] Assignee: International Telephone & Telegraph Corporation, Nutley, N.J.

[22] Filed: Dec. 12, 1974

[21] Appl. No.: 532,108

[52] U.S. Cl. ............... 325/411; 325/414; 325/439
[51] Int. Cl.² ........................................... H04B 1/16
[58] Field of Search ............ 325/62, 319, 401, 411, 325/414, 430, 438, 439, 442, 451; 331/182, 183

[56] References Cited
UNITED STATES PATENTS
| | | | |
|---|---|---|---|
| 2,279,128 | 4/1942 | Pasplay | 325/414 |
| 3,619,786 | 11/1971 | Wilcox | 325/411 |

*Primary Examiner*—Albert J. Mayer
*Attorney, Agent, or Firm*—John T. O'Halloran; Menotti J. Lombardi, Jr.; Alfred C. Hill

[57] ABSTRACT

The amplitude of a local oscillator signal for use with a frequency mixer is maintained at a given constant level by a control signal derived from the direct current flow through the mixer diodes.

10 Claims, 1 Drawing Figure

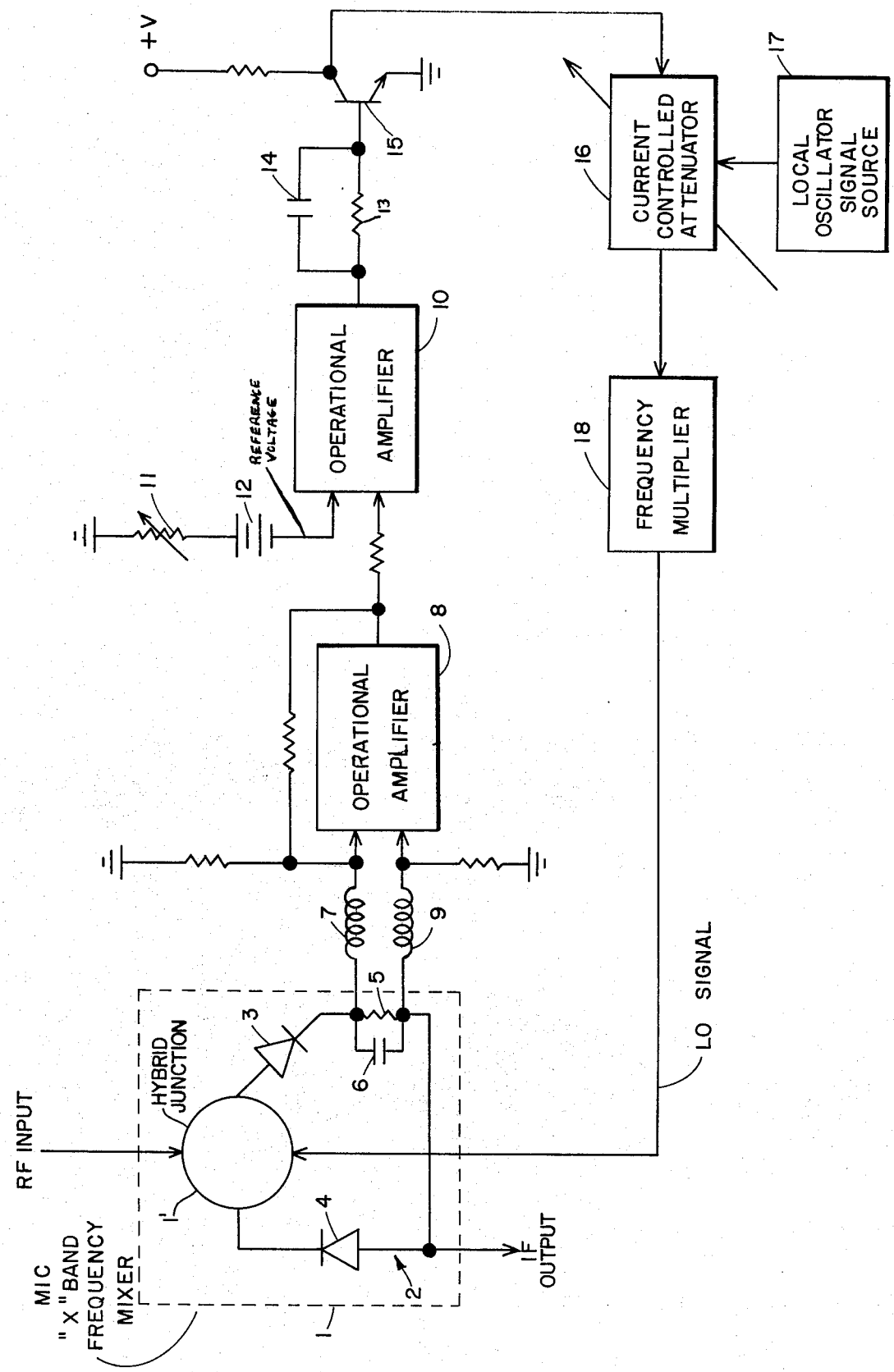

AUTOMATIC LEVEL CONTROL CIRCUIT FOR LOCAL OSCILLATOR SIGNALS WITH THE LEVER CONTROL SIGNAL BEING DERIVED FROM THE DC CURRENT PRESENT IN THE DIODE CIRCUIT OF AN MIC FREQUENCY MIXER

BACKGROUND OF THE INVENTION

This invention relates to automatic level control circuits and more particularly to such circuits to maintain a constant level for a local oscillator signal applied to a frequency mixer.

Automatic level control circuits are often used to keep a local oscillator signal level constant when coupled to frequency mixers. A constant local oscillator signal level is important to maintain a smooth conversion loss over the RF (radio frequency) frequency band. Generally the automatic level control signal is obtained by sampling and detecting a portion of the local oscillator signal power before it enters the mixer.

SUMMARY OF THE INVENTION

An object of the present invention is to provide an automatic level control circuit which derives the control signal from the DC (direct current) current flowing through the mixer diodes.

A feature of the present invention is the provision of an automatic level control circuit for local oscillator signals coupled to frequency mixers comprising: a source of local oscillator signals; a frequency mixer including a circuit having a pair of series connected diodes therein; first means coupled to the circuit to derive a level control signal from the direct current flowing in the circuit; and second means coupled to the source, the mixer and the first means, the second means being responsive to the control signal to maintain the local oscillator signals at a selected constant level.

BRIEF DESCRIPTION OF THE DRAWING

The above-mentioned and other features and objects of this invention and the manner of obtaining them will become more apparent by reference to the following description taken in conjunction with the drawing, the single FIGURE of which is a schematic, partially block diagram of an automatic level control circuit in accordance with the principles of the present invention.

DESCRIPTION OF THE PREFERRED EMBODIMENT

Referring to the drawing, MIC (microwave integrated circuit) X-band frequency mixer 1 of conventional implementation includes a hybrid junction 1' receiving the RF input and local oscillator (LO) signal and a circuit 2 having a pair of series connected diodes 3 and 4 coupled to hybrid junction 1'. Such a mixer arrangement is substantially disclosed in the article "A Stripline Frequency Translator" by E. M. Rutz in the March 1961 issue of IRE Transactions On Microwave Theory and Techniques, pages 158 – 161. Resistor 5 is inserted in circuit 2 to provide a voltage proportional to the DC current flowing in circuit 2. Capacitor 6 is a by-pass capacitor in shunt with resistor 5 so that resistor 5 will not attenuate the amplitude of the AC (alternating current) voltage flowing in circuit 2.

An RF choke 7 is coupled between one terminal of resistor 5 and one input of operational amplifier 8. RF choke 9 is coupled between the other terminal of resistor 5 and the other input of operational amplifier 8. The RF chokes 7 and 9 are RF isolators so that the RF signal in circuit 2 will not be coupled to the inputs of amplifier 8. Amplifier 8 is for the purpose of converting a balanced input to an unbalanced output.

The output of amplifier 8 is coupled to one input of operational amplifier 10 which has its other input coupled to a reference voltage source including variable resistor 11 and battery 12. The adjustable reference voltage in cooperation with operational amplifier 10 operating as a comparator enables selecting the constant level desired for the local oscillator signal which is to be applied to mixer 1.

The output of amplifier 10 is coupled to a resistor 13 in parallel with capacitor 14 and, hence, to the base of transistor 15. Resistor 13 and capacitor 14 form a shaping resistor-capacitor network to control the gain of the control loop. This network provides an increased gain of the loop at high frequencies. Transistor 15 amplifies the output of amplifier 10 to supply enough current for operation of current controlled attenuator 16.

A local oscillator signal source 17 is also coupled to attenuator 16 which may be in the form of PIN diodes whose resistance changes proportional to the amplitude of the control current input supplied by transistor 15. The output of attenuator 16 may be coupled directly to mixer 1 if the frequency of the signal from source 17 is sufficient for the application in which the mixer 1 is to be employed. Normally, however, the output of attenuator 16 is coupled to frequency multiplier 18 to provide the desired local oscillator signal for coupling to mixer 1.

The advantages of the circuit just described are, among others, as follows. First, the prior art local oscillator signal detector diodes and substrate can be eliminated which will represent a cost reduction. Also the test and alignment time is no longer required as was in the prior art. Second, the mixer diode current is a more sensitive measure of the local oscillator signal power required for optimum conversion loss. Third, using the mixer diode current to derive the level control voltage will enable "leveling out" of all mismatches and losses between the multiplier output and the actual diode drive point in the mixer. Fourth, the mixer diode current level can be used as a monitoring signal to monitor the local oscillator power and mixer performance.

While I have described above the principles of my invention in connection with specific apparatus it is to be clearly understood that this description is made only by way of example and not as a limitation to the scope of my invention as set forth in the objects thereof and in the accompanying claims.

I claim:

1. An automatic level control circuit for local oscillator signals coupled to frequency mixers comprising:
   a first source of radio frequency signals;
   a second source of local oscillator signals;
   a frequency mixer including a hybrid junction coupled to said first source and a circuit having a pair of series connected diodes therein coupled to said hybrid junction;
   first means coupled to said circuit to derive a level control signal from the direct current flowing in said circuit; and
   second means coupled to said second source, said hybrid junction and said first means, said second means being responsive to said control signal to maintain said local oscillator signals coupled to said hybrid junction at a selected constant level.

2. A circuit according to claim 1, wherein said first means includes
   a resistor disposed in said circuit in series with said diodes to derive said level control signal.

3. A circuit according to claim 2, wherein said first means further includes
   a capacitor disposed in shunt relationship with said resistor to provide an alternating current bypass around said resistor.

4. A circuit according to claim 3, wherein said first means further includes
   a first operational amplifier having each of its two inputs coupled to a different terminal of said resistor.

5. A circuit according to claim 4, wherein said first means further includes
   a radio frequency choke coupled from each of said terminals of said resistor to an associated input of said first amplifier.

6. A circuit according to claim 5, wherein said first means further includes
   a second operational amplifier having two inputs, one of said two inputs of said second amplifier being coupled to the output of said first amplifier, and
   a source of variable reference voltage coupled to the other input of said two inputs of said second amplifier,
   said second amplifier and said source of variable reference voltage cooperating to adjust the amplitude of said level control signal and enable selecting said selected constant level.

7. A circuit according to claim 6, wherein said first means further includes
   a transistor amplifier coupled to the output of said second amplifier to amplify said level control signal prior coupling to said second means.

8. A circuit according to claim 7, wherein said first means further includes
   a parallel resistor-capacitor network coupled between the output of said second amplifier and the base of said transistor to control loop gain.

9. A circuit according to claim 8, wherein said second means includes
   a current controlled attenuator.

10. A circuit according to claim 1, wherein said second means includes
    a current controlled attenuator.

* * * * *